United States Patent [19]

Quintard

[11] Patent Number: 5,208,528

[45] Date of Patent: May 4, 1993

[54] METHOD FOR INSPECTING A POPULATED PRINTED CIRCUIT BOARD, PARTICULARLY FOR INSPECTING SOLDER JOINTS ON THE BOARD AND A SYSTEM FOR WORKING THIS METHOD

[75] Inventor: Alain Quintard, La Ville du Bois, France

[73] Assignee: Bull S.A., Paris, France

[21] Appl. No.: 925,903

[22] Filed: Aug. 6, 1992

Related U.S. Application Data

[63] Continuation of Ser. No. 576,430, Oct. 31, 1990, abandoned.

[30] Foreign Application Priority Data

Jan. 19, 1989 [FR] France ............................... 89 00612

[51] Int. Cl.$^5$ ...................... G01R 31/02; G01N 21/71
[52] U.S. Cl. .............................. 324/158 R; 250/338.1; 250/341; 324/73.1
[58] Field of Search .............. 324/158 R, 158 F, 73.1; 250/338.1, 3.41

[56] References Cited

U.S. PATENT DOCUMENTS

| | | | |
|---|---|---|---|
| 3,463,007 | 8/1969 | Jones et al. | 324/537 |
| 3,803,413 | 4/1974 | Vanzetti et al. | 250/338.1 |
| 3,868,508 | 2/1975 | Lloyd | 250/330 |
| 4,481,418 | 11/1984 | Vanzetti et al. | 250/338.1 |
| 4,792,683 | 12/1988 | Chang et al. | 250/341 |
| 4,965,451 | 10/1990 | Solter | 250/341 |

OTHER PUBLICATIONS

"Infrared Imaging Pins Down PC-Board Solder-Joint Faults", Electronic Design, vol. 28, No. 3, Feb. 1, 1980), (Rochelle Park, US).
"The Infrared Signature for PC Boards Maintenance", J. M. Konklin, et al, 28th Electronic Components Conference, Anaheim, Calif. Apr. 24-26, 1978, IEEE, (New York, US) pp. 286-289.
"New Concepts of Applying Thermographic Testing to Printed Circuit Boards and Finished Products", H. Boulton, Proceedings of the International Test Conference, Nov. 19-21, 1985, IEEE, (New York, US).
"Pinpointing Shorts with Color Thermography", K. Pomeroy, Electronic Tests, vol. 11, No. 6, Jun. 1988 (San Francisco, Calif., US), pp. 89, 90, 92.

*Primary Examiner*—Ernest F. Karlsen
*Attorney, Agent, or Firm*—Weingarten, Schurgin, Gagnebin & Hayes

[57] ABSTRACT

The invention relates to a method for inspecting a populated printed circuit board, particularly for inspecting the solder joints on the board, and advantageously usable for boards populated with surface-mount (SM) components. According to the invention, the inspection method comprises at least the following steps:

briefly heating the board (or an extensive portion thereof),
recording a thermographic image of the board (or of said extensive portion) when said heating step has stopped, and preferably as soon as it stops,
analyzing the image by detecting a difference in heat between a predefined standard and the areas of the board to be inspected, for example the soldered areas.

The invention also relates to a system for working the inspection method.

15 Claims, 3 Drawing Sheets

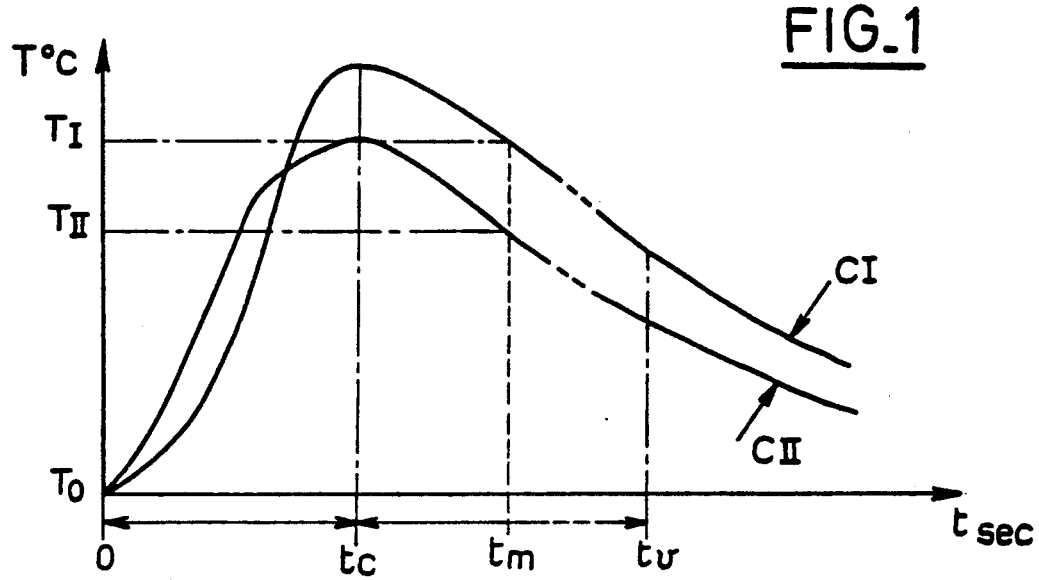
FIG_1
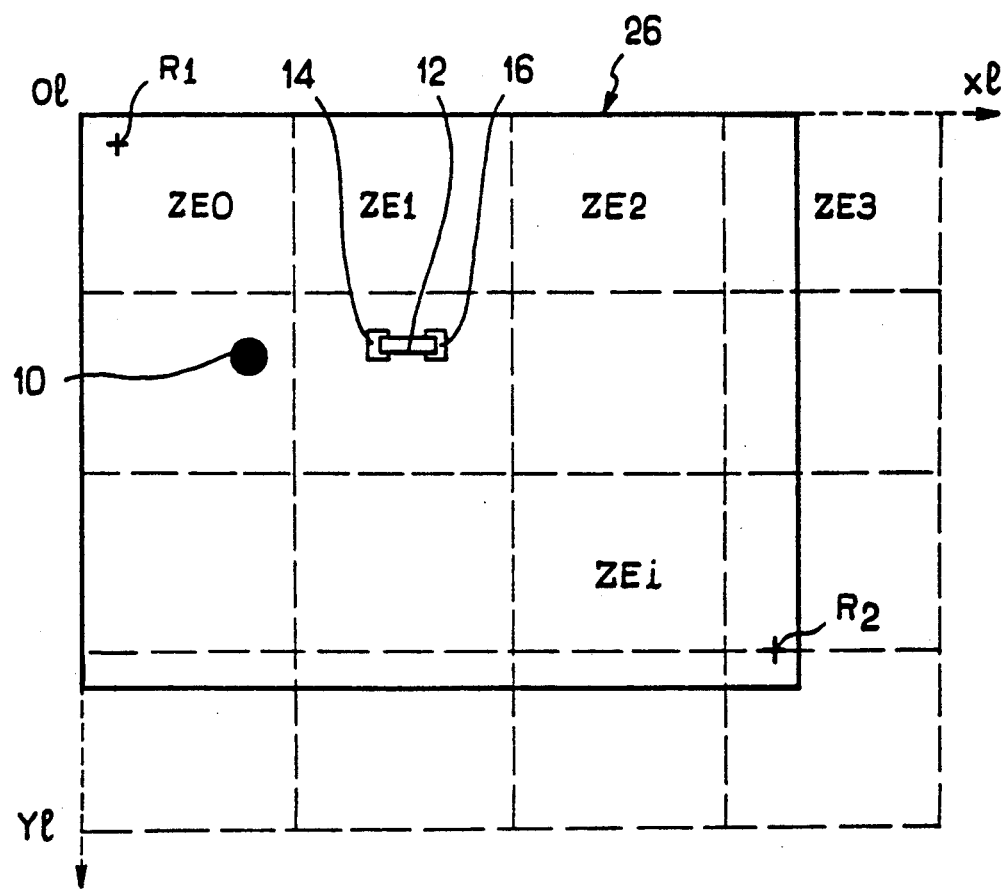
FIG_2

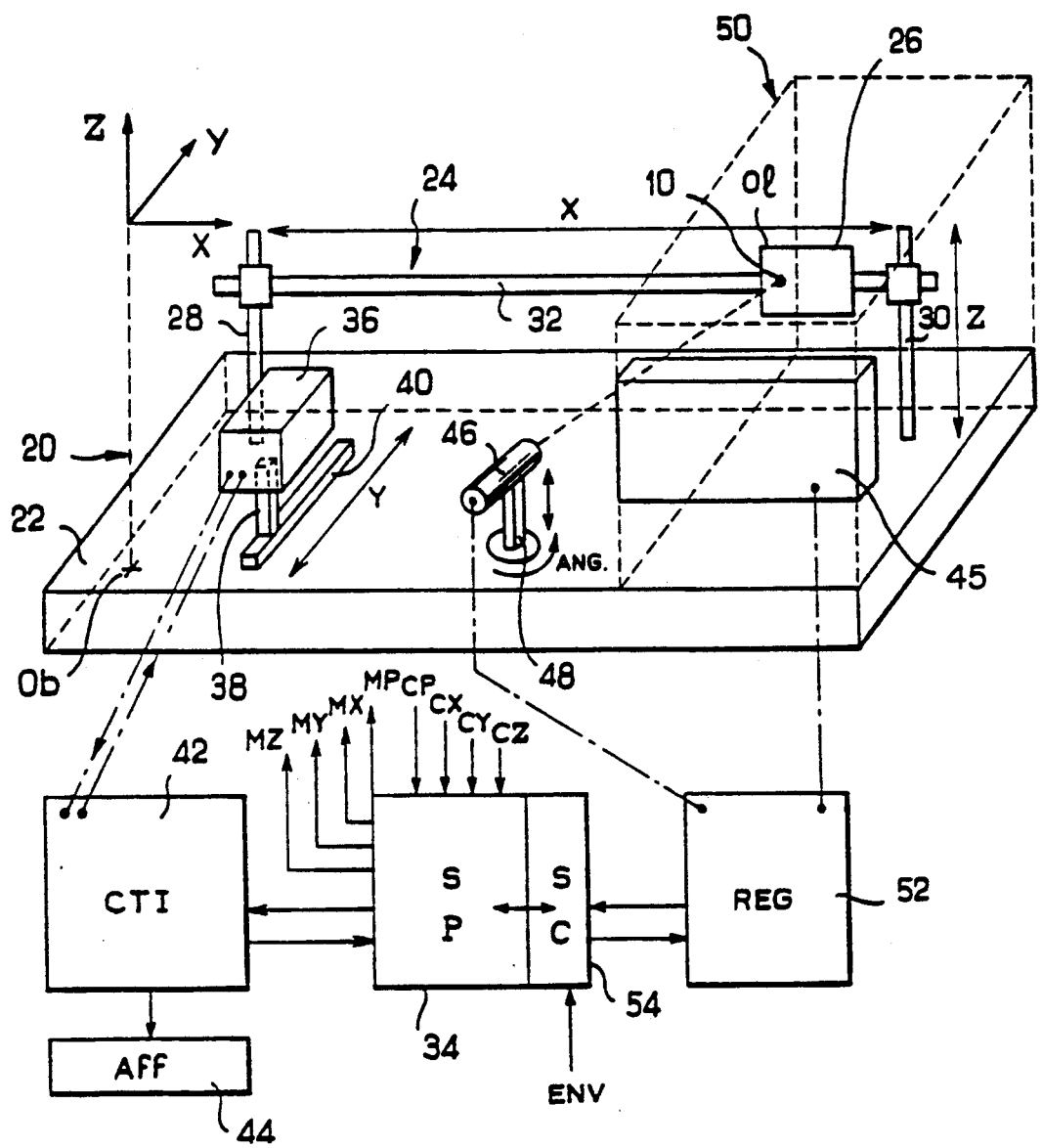
FIG_3

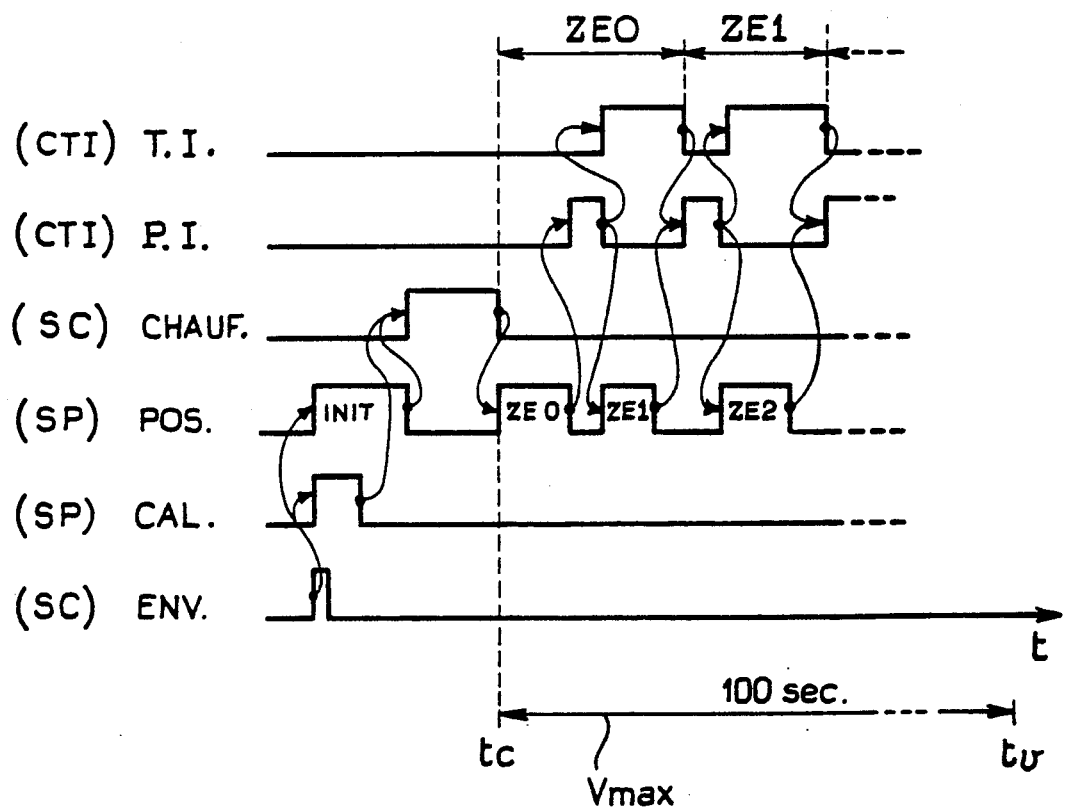
FIG_4

METHOD FOR INSPECTING A POPULATED PRINTED CIRCUIT BOARD, PARTICULARLY FOR INSPECTING SOLDER JOINTS ON THE BOARD AND A SYSTEM FOR WORKING THIS METHOD

This application is a continuation of application Ser. No. 07/576,430, filed Oct. 31, 1990, now abandoned.

The present invention relates to a method for inspecting a populated printed circuit board, in particular inspecting the solder joints on the board. A "populated printed circuit board" is understood to be a printed circuit board whose architecture is built around a layer of insulating material such as epoxy resin and has a certain number of electronic components. There are two types of such electronic components: passive components such as resistors and capacitors, and active components such as diodes, transistors, and integrated circuits.

These components are soldered on by classical methods such as flow soldering or reflow soldering, particularly the variant known as vapor soldering, whereby the solders in common use are tin-lead-alloy-based. After the soldering operation, prior to any powered function test of the printed circuit board, the integrity of the board, particularly the mechanical and electrical quality of the solder joints, must be inspected. Today, it is considered that the majority of defects (not including components) in a populated printed circuit board are due to the soldering. More rarely, defects are caused by the absence, poor positioning, or poor functioning of certain components. To perform this first inspection, today a device known as a "bed of nails" is used, provided with a large number of tips which come in contact with certain points in the circuit to be inspected. These devices, which give good results, are however relatively difficult to manufacture and use, since they must be adapted to each type of board to be inspected.

Moreover, these devices do not allow for spot inspection of solder joints, but only checking good electrical conduction between several points in the circuit by comparison to the schematic (in fact, only visual examination under a binocular microscope, with its constraints and limitations, allows this direct inspection of a solder joint).

In addition, introduction of the new technique known as surface-mount (SM) technology has allowed miniaturization of printed circuits and their components, which miniaturization raised real problems when inspecting SM boards using devices of the "bed of nails" type: The minimum size of the tips of the "nails" is too large to permit them to access overcrowded areas of the board. As an example, the average spacing used in SM boards is 1.27 mm instead of 2.54 mm for classic boards. With the adoption of the new 0.3 mm standard for SM boards, inspection devices of the "bed of nails" type will be totally unsuitable or even unusable.

Attempts have been made to inspect joints using x-rays. Although this method theoretically gives good results, it does have a number of drawbacks in practice: price, and difficulty of implementation.

The use of laser thermography for individual inspection of joints is known, carried out point by point discontinuously after each phase in making the solder joint. As a result, this method is unsuitable for final inspection of solder joints on fully populated printed circuit boards.

The above considerations show the main characteristics required of a populated printed circuit board inspection method, particularly soldering inspection:

The method must be of the nondestructive type; it must not pose the risk of damaging the board or its components.

The method must be automatable for reasons of speed but also to eliminate subjective judgments which vary from one operator to another.

The method must allow immediate pinpointing of defective joints on the board so that specific repairs can be made.

Finally, the inspection method must, to be efficient, be easy to implement, be adaptable to various board types, be rapid, and be relatively inexpensive.

For this purpose, the invention proposes a method for inspecting a populated printed circuit board, particularly for inspecting the solder joints of the board, characterized by comprising at least the following phases:

brief heating of the board (or an extensive portion thereof), recording a thermographic image of the board (or of said extensive portion) when heating has stopped, and preferably as soon as it stops, analyzing the image by detecting the difference in heat between a predefined standard and the areas of the board to be inspected, for example the soldered areas.

By using pulsed or brief heating, the method according to the invention allows the quantity and quality (cracks, excess amounts, etc.) of the solder (and the absence thereof) to be evaluated in the various soldered areas to be inspected. Likewise, because of the weight of each component, it is possible to detect their absence or poor positioning.

According to one embodiment of the invention, to allow for good inspection repeatability, a predetermined threshold of the heat difference considered permissible for solder joint inspection is chosen as a function of the average temperature reached at the surface of the board when heating stops.

The method according to the invention gives particularly good results when the permissible heat difference threshold is established at 3° C. for an average heating temperature of about 70° C.

In another embodiment of the method according to the invention, heating is stopped when the surface temperature of a target point on the board reaches a set value, for example 70° C. By choosing, as a target point, a reliable zone of the board where it is unlikely that there will be heat differences from one board to another, a near-perfect reference is obtained.

In still another embodiment, the board is heated in laminar fashion. This prevents the creation of turbulent heating zones that could introduce substantial heat differences into the board, undesirable for inspection of solder joints. Preferably, the board is heated by a quartz lamp "pyropanel".

According to another embodiment of the invention, the image is recorded in real time by an infrared camera. Advantageously, the infrared camera is of the quantum detector (photoexcited) type, operating in a spectral range between 8 and 12 microns.

According to another embodiment of the method according to the invention, a standard image is defined for each type of board with two-dimensional geographic pinpointing of the actual locations of selected points in the printed circuit and the components with which the board is populated. Advantageously, geographic pinpointing is associated with virtual division of the board into individual scanned zones, each corresponding to the field of the infrared camera. Moreover, geographic pinpointing detects the actual location inside each scanned zone in the various regions inspected, particularly soldered areas. Finally, the actual location of the area where a defective solder joint is found (like that of any other region recognized to be defective) is displayed after image analysis.

According to another embodiment of the method according to the invention, a complete image of the board (or an extensive portion thereof) is recorded by laterally displacing the field of the camera with respect to the board, where each camera/board position corresponds to an individual scanned zone covered by the camera field.

According to yet another embodiment of the method of the invention, the standard is created by mixing a plurality of images obtained from reference boards of the same type, that are deemed acceptable.

The invention also relates to a system for working the method defined above, the system being characterized by comprising:

a board support provided with an arrangement allowing two-dimensional geographic pinpointing of any given point on the board, hereinafter called actual location, a heating system, an image-recording system, comprising an infrared camera and a converter generating, for each individual image recorded, an information block having, for each image point of the image field of the camera, the corresponding image location and a measurement signal that represents the temperature at the associated point on the board covered by the unit object field of the camera, a camera-field aiming device associated with said board support, said geographic pinpointing arrangement being designed to pinpoint the position of the camera with respect to the board, an image analysis system comprising means for storing a block of information corresponding to an individual recorded image, means associated with said geographic pinpointing arrangement to determine the actual location of an object point associated with a given image location of a given information block and to match an actual location to each measurement signal, means for storing a standard image that is composed of a set of standard signals, each standard signal being matched to the actual location of an object point on the board, means for comparing, for a given actual location, the measurement signal with the standard signal, and means for displaying the actual location concerned and the result of the comparison operation.

According to one embodiment of the system used in the invention, this system comprises an inspection station able to stop the heating phase and start the phase in which the thermographic image of the board is recorded. Advantageously, the heating system comprises a heating module controlled by a regulating device sensitive to a temperature-measurement signal generated by a pyrometer. The inspection station is thus able to stop the heating phase when the temperature measured by the pyrometer reaches a preset value. A pyrometer-adjusting device is associated with the board support to position the spatial field of the pyrometer on a preselected target point on the board. Advantageously, the inspection station has automatic means for controlling the adjusting device according to the actual location of the target point.

According to a particular embodiment of the system according to the invention, the board support has, in addition to said geographic pinpointing arrangement, a fixed frame bearing the camera field aiming device and is provided with board guide means. Advantageously, the geographic pinpointing arrangement is of the three-dimensional type and has a pilot station to determine the positioning of the camera field and has control means for actuating the board guide means and the aiming device so as to allow relative displacements between the board and the camera field. In addition, the guide means comprise a set of guide rails and a carriage bearing the board to allow it to move in two perpendicular directions.

According to another particular embodiment of the system according to the invention, a pilot station controls the image recording and analysis systems and manages a method of recording and analyzing individual images sequentially from a virtual division of the board into elementary scanned zones corresponding to the object field of the camera covered by an individual image. Advantageously, the pilot station generates individual image recording orders according to a predefined program for geographically scanning the board. The pilot station transmits, to the means for matching each measurement signal to an actual location that are present in said image analysis system, information on the position at any point in time of the camera field relative to the board used when the individual image is recorded. Finally, the pilot station causes relative displacement between the board and the camera field after each individual image to be recorded.

According to yet another particular embodiment of the system according to the invention, the pilot station, the inspection station, and the image analysis system are of the digital computer type. Advantageously, the pilot station and inspection station are coordinated by the central processing unit of a common digital computer.

The invention will now be described with reference to the attached figures wherein:

FIG. 1 is a graph of temperature versus time for solder joints of different qualities.

FIG. 2 is a schematic representation of a populated printed circuit board illustrating the geographic pinpointing of given points on the board.

FIG. 3 is a schematic representation of a system for working the method according to the invention.

FIG. 4 is a schematic representation of a graph plotting the progress of board inspection according to the invention.

In the field of solder joint inspection on a populated printed circuit board, a "poor" joint is generally characterized quantitatively by insufficient material or quite simply absence of material in the predefined soldering area. In addition, a "poor" solder joint can have defects of a qualitative nature having to do with the distribution of the soldering material (e.g. cracks, excess material, wisps, etc.). All these defects (both quantitative and qualitative) can eventually cause mechanical failure of the joint and/or defects in the electrical connections.

It is this variation in the mass of soldering material or distribution of this material in the soldering area that is recorded by the thermographic inspection method according to the invention. The method is based partly on the observation that quick, short-term heating, sometimes called pulse heating, of the board to be inspected, results in variations in the surface temperature of a given soldering area depending on the quantity and/or distribution of the soldering material added (the heating time selected is too short to allow the temperature to even out throughout the mass of the board). In general, at the end of the heating period, the surface temperature of an undersized solder joint will be less than that of a sufficiently supplied joint. Likewise, the heat energy stored in the joint, proportional to the mass of material present, will be small. This phenomenon is illustrated in FIG. 1, with two schematic curves showing temperature as a function of time during the heating and cooling phases for an "acceptable" solder joint (curve C I) and a "defective" joint (curve C II) in surface-mounted components. The horizontal axis of FIG. 1 is the time in seconds of the sample heating period (0—tc), followed by the validity range for the measurements made during cooling (tc—tv), during which "window" a thermographic image will be recorded, for example at time tm. The temperature values measured are plotted on the vertical axis. The temperature origin, corresponding to room temperature To in the space surrounding the test bench, will be the zero point for the two curves.

In general, the temperature rise curves result from a number of parameters, principally the physical characteristics of the board and its components and the heating method. Appropriate heat regulation for a given board makes it possible to obtain a given curve shape. Although heating must be brief to prevent the heat from stabilizing throughout the board (eventually the solder joints will be the same temperature), it must last long enough to bring the board to an appropriate set temperature to obtain temporarily, at the end of heating, significant temperature differences at the board surface (and avoid, for example, perceptible temperature inversion effects right at the start of heating, resulting from the lower thermal inertia of defective solder joints). As a non-limiting example, the heating power was, in the present case, reduced gradually when approaching the set temperature, in this instance 70° C. Moreover, for heating from 20° to 70° C. lasting an average of 10 seconds, differences on the order of 5° C. were detected.

During the cooling phase, the two curves are essentially parallel, then move closer, tending asymptotically toward the value To. In the framework of the invention, as related below, the time tv is chosen such as to ensure that the heat difference detected and used for qualification of the inspected solder joint does indeed reflect the presence of insufficient or irregular soldering material.

The method according to the invention applies the physical phenomenon described above. More specifically, the inspection method according to the invention has at least the following three stages:

brief heating of the printed circuit board populated for example with surface-mount (SM) components (or of said extensive portion of this board), recording a thermographic image of the board when heating has stopped, and preferably as soon as it stops, analyzing the image by detecting the difference in heat between a predefined standard and the areas of the board to be inspected, for example the soldered areas.

In the embodiment of the method according to the invention described here as a non-limiting example, the image is recorded in real time by an infrared camera of the quantum detector (photo-excited) type operating in the spectral range between 8 and 12 microns. This camera measures, in the infrared spectrum, the heat energy radiated at various points on the board, particularly the soldering areas, and furnishes a measurement signal corresponding to the temperature of the unit surface scanned. To avoid parasitic radiation from the components, the board is left unpowered. It is interesting to note that this type of camera allows measurements to be made in low temperature ranges, about 70° C. for example, without risk of damaging the board or its components, and allows repeated images to be recorded very rapidly before the board cools too much. Preferably, for a set temperature of 70° C., the tolerated heat difference for an "acceptable" solder joint must be less than 3° C. Under these conditions, the measurement validity window Vmax is about 100 seconds.

In addition to ensure good repeatability of inspection and avoid problems of scattered measurements due to locally turbulent heating, laminar heating by a quartz lamp "pyropanel" is provided. Specifically, heating is regulated, optionally preprogrammed starting at the temperature at a given point in time measured at a target point on the surface of the board by a pyrometer. For example, it is possible gradually to reduce the heating power near the set temperature. When the set temperature is reached, which temperature is preferably on the order of 70° C., heating is stopped and the image-recording phase started. It should be noted that the choice of a thermally reliable target point (dark body with good thermal emissivity, not sensitive to manufacturing variations in populated printed circuit boards) provides a good reference base, necessary in this type of inspection which is of the relative type.

In one embodiment of the method according to the invention, the images are recorded sequentially after virtual division of the board (or the extensive portion subjected to heating) into individual scanned zones corresponding to the spatial field covered by the camera. For example, the system described hereinbelow operates with unit board zones measuring 35×26 mm for boards whose maximum dimensions are 500×400 mm. FIG. 2 shows schematically a board with its actual local coordinate axes 01X1, 01Y1 and indexing and reference points R1 to R3 of the board with respect to any support (for example the frame of the station where the components are mounted on the board). FIG. 2 also shows schematically target point 10 for the pyrometer and a surface-mounted component 12 (e.g. a resistor) with its two soldering areas 14 and 16. The unit zones are labeled ZE0 . . . ZEi. Moreover, geographic pinpointing allows the various regions and/or solder joints being inspected to be located in each zone. Specifically, for each type of board, a geographic grid is constructed, serving as the basis for a standard image with which the image of the board to be inspected will be compared. In practice, the basic grid is constructed from data generated when the printed circuit and complete board are designed with a Computer Aided Design (CAD) program. The standard image is created by mixing a plurality of images obtained from reference boards of the same type. Optimally, this standard image is parametrized.

According to the invention, the board is moved to position zone ZE0 relative to the camera field as soon as heating stops outside the spatial field of the pyropanel. An individual heat image is then recorded, it being understood that the position of the camera field relative to the board is transmitted to the image analysis system to enable it to match up an image point with an actual location on the board. Thus, a defective soldering area (like any other defective region) will be identified, pinpointed, and displayed. After each individual image analysis, the board is moved laterally relative to the camera field to allow another image to be recorded until no more zones ZEi remain to be scanned.

It is to be understood that the method according to the invention may give rise to a large number of variations, as desired by the experimenter and in view of each practical situation. Nonetheless, these variations must follow the three operating phases characteristic of the invention.

The above explanation showed some very useful advantages of the method according to the invention. Noteworthy among them area: the adaptability of the method according to the invention to very highly automated inspection of the integrity of the board and particularly the solder joints, which automation eliminates human intervention in the evaluation of solder joint defects. In addition, the very principle of optical inspection allows very fine spatial resolution between two regions or two soldering areas being inspected, reaching values less than one millimeter that are impossible for devices of the "bed of nails" type. Finally, by using the computer programs and files used in CAD for designing the board under test, it is possible to modify the grid of the inspected regions of a given board type, and even modify the standard images with no major difficulty or time expenditure. Other advantages of the invention will emerge from the remainder of the description relating in particular to one embodiment of a system for working the method according to the invention.

The system according to the invention, illustrated schematically in FIG. 3, is physically built around a board support 20 composed of a frame 22, such as a granite anti-vibration optical bench. The surface of the bench has a network of threaded inserts allowing attachment and spatial identification of various elements of the test bench. Guide means 24 for board 26 are firmly attached to bench 22. These guide means are composed of X rails, specifically two vertical rails 28 and 30 bearing a horizontal rail 32 on which a moving carriage of the type with perpendicular two-directional movement may travel (not shown in FIG. 3), bearing board 26. The carriage has centering points which, in cooperation with board reference marks R1 and R2, allow board 26 to be held and also very precisely located relative to frame 22.

The arrangement so describe allows a three-dimensional reference with origin Ob to be defined at X, Y, Z; the X axis extends parallel to horizontal rail 32 and the Z axis (or vertical axis) extends parallel to rails 28 and 30. Two stepping motors coupled with position sensors (MX and CX for movement of the movable carriage on rail 32 and MZ and CZ for vertical positioning of board 26) are provided on the board-holding carriage on rail 32. These motors and sensors (not shown in FIG. 3, but only identified) are connected to a pilot station SP 34 of the digital computer type. Thus, pilot station 34 is capable of pinpointing the actual location of point Ob relative to the point of origin O1 on the board and thus the location of each point on the board, particularly the soldering areas where the joints are to be inspected. Moreover, the pilot station controls stepping motors MX and MZ in such a way as to allow translational displacement of the board in a plane parallel to plane ObX, ObZ.

Frame 22 also supports an infrared camera 36 mounted on camera field aiming device 38, itself slidably mounted on a slide 40 integral with frame 22 and extending parallel to the Y axis. Here again, the movement of camera field aiming device 38 (in the embodiment described here, of the camera itself) is controlled by a stepping motor MY (not shown) controlled by pilot station 34 as a function of the information supplied by associated sensor CY. Thus, pilot station 34 is able instantly to detect the position of the camera field relative to the board. This important feature for working the invention can, however, without departing from the framework of the invention, be achieved in a way other than that described herein (relative lateral movements between the board and the camera), in particular by means of an optical scanning system appropriately disposed in the optical path between the camera lens and the board. The camera, which will be described in greater detail hereinbelow, is connected to a CTI 42 image analysis system of the digital computer type provided with a display 44 such as a video screen and/or printer and/or plotter.

Frame 22 also supports several components of a heating system, in particular a quartz lamp pyropanel 45 and a pyrometer 46 mounted on an adjusting device 48. Pyropanel 45 is housed in an enclosure 50 made of refractory material and mounted to the right of frame 22 as viewed in FIG. 3. Thus, the board is heated in this enclosure 50 while thermal image-recording occurs after the board has been moved toward the camera, i.e. toward the left side of the frame, to avoid any parasitic radiation coming from the heating system. A heat shield (not shown) is disposed around the board to protect the guide rails and motors from the heat energy radiated by the pyropanel. In the testing apparatus described here, the heating power is fairly high —20 kW—to achieve a fairly short heating time (board rises from 20° C. to 70° C. at mid-power in less than 10 sec.). Heating is controlled by a regulator 52, itself under the control of an inspection station SC 54. The operator is thus able to preprogram the heating curve and number of quartz lamps in use as a function of the size of the board to be tested, it being understood that the device used allows laminar heating to be obtained without local heat turbulence.

Pyrometer 46 is of the pyroelectric detector type operating in a spectral range of 8 to 12 microns. The detector, correctly adjusted to target 10 on the board, detects the energy emitted by the surface of the target (with an average diameter of 5 mm) and delivers an output voltage corresponding to the temperature of this surface. The signal is transmitted to the regulator which stops heating as soon as the set temperature (70° C.) displayed by the inspection station is reached. In the apparatus described here, the pyrometer and its converter-display, marketed under the "Land" trademark by the Schlumberger Company, provide an accuracy of less than 0.5° C. The adjusting device of pryrometer 48 has a plate rotating through 360° and is provided with stepping motors (identified as a unit by MP) and sensors (CP) able to position the pyrometer heightwise (Z axis) and directionwise (angle of rotation ANG). Motors MP and sensors CP are appropriately connected to inspection station 34 to adjust the pyrometer automatically for a given board type.

Pilot station 34 and inspection station 54 are grouped and placed under the control of the CPU of a Bull Micral Model 40 (BM 40) microcomputer with control software. Despite fairly long useful travel distances of guide means 24 and slide 40, X=1250 mm, Y=630 mm, Z=400 m, the geographic accuracy obtained is about 0.01 mm using motors whose unit displacement step is 0.127 mm.

The infrared camera 36 used is sold by the Inframetrics Company of Bedford, U.S.A. under the name "Model 600." More specifically, this camera, of the scanning type with second-order interlacing, is equipped with a liquid-nitrogen-cooled Hg-Cd-Te quantum detector operating in the 8 to 12 micron spectral range. The camera field is defined by the detector scanning angle, i.e. 20° H (horizontal) and 15° V (vertical). This allows resolution of 256 image points on 240 lines. When a camera setting corresponding to coverage by the camera of an individual scanning zone of 35×26 mm is chosen, true resolution on the board of 0.13 mm/H and 0.11 mm/V is obtained. The measurement signal furnished by each image point is digitized using 7 bits, corresponding to 128 measurable thermal luminance levels. The accuracy obtained is about 0.1° C. The thermal image-recording speed is fairly high: about 20 milliseconds for the frame and 55 microseconds per line.

On reception of an order to record an individual image, the camera transmits to the CTI 42 system, via a digital converter, an information block comprising the video signal representing the temperature measured at a point on the board, accompanied by synchronization signals allowing the line and frame scanning starts to be positioned (and hence the image points to be pinpointed). The CTI 42 image analysis system is structured around a Bull Micral Model 60 (BM 60) microcomputer controlled, as explained below, by pilot station 34, i.e. by the BM 40 microcomputer. The computer subsystem constituting the CTI 42 system has a large enough CPU and peripheral memory capacity to analyze and store board "images" each unit of which requires an available capacity of 128 kilobytes. This computer subsystem also has means for storing an information block coming from the camera converter and the hardware and software for determining, from a signal, the image serial number transmitted by pilot station 34 and the actual location of the object points associated with each image point and thus matching an actual location on the board with each measurement signal. The first image analysis phase ends with memorization of the image thus processed or of predefined parts thereof according to a pre-established geographic grid existing in a database in the CTI 42 system.

The CTI system also has in its memory a standard image formed using the same grid corresponding to a predetermined board type. The standard image can be created ab initio by programming; however, it proved useful and faster to create this image by mixing a plurality of thermographic images obtained under the same conditions by scanning at least ten boards deemed acceptable, for example by averaging the values measured. Of course, without departing from the framework of the invention, this standard image can be reworked with the aid of software employing various parameters. For example, it is useful to parametrize certain standard values to take into account the physical structure of the occupant of the region to be inspected. The difference threshold established as being 3° C. for soldering inspection is not always appropriate for certain components whose presence and correct mounting (position- and orientationwise) is to be checked. These components such as resistors, capacitors, and housings of transistors or integrated circuits (with their mounting pins) have different thermal characteristics (thermal capacity and emissivity) that are sufficiently different from that of the solder joints that it is useful to change the heat difference threshold for the corresponding regions to be scanned.

Thus, the CTI system is able to make a point-by-point comparison (limited to the preselected points on the grid) of the measurement signals with the standard values and, by display means 44, to identify and locate the defective region, for example of the soldered area in which the surface temperature of at least one individual scanned point on the board (0.13×0.11 mm) is over 3° C. less than the standard temperature at the same point.

It may be noted that the analysis so performed is very fine since a soldering area has an average surface area of 1.5 mm$^2$, i.e. 100 times the resolution of the testing system. The system according to the invention thus gives information on the actual quality of the defect (crack, excess material, wisps, etc.) and on its location in the soldering area and indicates whether changes need to be made in the soldering preparation and operation. Likewise, the system according to the invention allows all desired counting and statistical operations to assist in developing and inspecting an automatic manufacturing process to be carried out.

For each new board type, the operator will carry out the following preliminary operations:

From CAD files and programs corresponding to the board designs, determine the geographic grid of the regions, in particular soldering areas, to be inspected and load a special "grid" file into the memory of the BM 60 computer subsystem of system 42.

From the "grid" file, determine the position of the target and load this position into memory. Either the BM 60 subsystem or the BM 40 subsystem can be loaded with this information.

Make a virtual division of the board from the "grid" file into individual scanning zones and store the sequence of the relative camera/board positions of each individual scanning unit in the memories of subsystems BM 40 and BM 60.

Select the temperature setting for inspection station 54.

Select about ten boards deemed acceptable and match the thermographic images to the corresponding references.

Create the standard image by mixing and possibly parametrizing the reference images. (Note that it is possible to test the reference images with respect to the standard image and make dispersion studies region by region, particularly in the soldering areas to be inspected).

Store the standard image in memory.

Thus, the BM 40 and BM 60 computer subsystems are loaded with their operating software and files designed for the various board types to be inspected. It is then possible to inspect a mass-produced board according to a pre-stored typed as it leaves the manufacturing run. This inspection occurs as described hereinbelow with reference to the graph in FIG. 4:

After placing the board on its carriage, the operator sends a manual signal (ENV=1) to inspection station SC 54. The latter coordinates, with pilot station SP 34, the initial positioning INIT of the board in refractory enclosure 50 (POS=1) and correct adjustment of pyrometer 46 to target point 10 on the board (CAL=1).

An end-of-preparation signal (CAL=0 AND POS=0) is transmitted by pilot station 34 to inspection station 54 which can thus start the heating phase proper (CHAUF=1).

As soon as the set temperature is reached at the surface of the target, an end-of-heating signal (CHAUF=0) is transmitted from inspection station 54 to pilot station 34 which takes over (POS=1). After the board has moved out of refractory enclosure 50, pilot station 34 will position the board relative to the camera in order to cause the latter to be covered by individual zone ZE0; an end-of-transport signal (POS=2) will then be generated in pilot station 34. The pilot station will then transmit to the CTI 42 system an image-recording signal (P.I.=1) for the camera. Because of the advanced automation of the apparatus according to the invention, the time interval between the end-of-heating signal (CHAUF=0) and the first image-recording signal (P.I.=1) does not exceed a few seconds. The camera image is thus recorded in real time and transmitted to image-analysis system CTI 42 which also receives from the pilot station, along with the image-recording signal (P.I.=1) a signal signifying the serial number of the zone scanned by the camera field. Because of this signal, system CTI 42 is able to restore the actual location of each object point scanned for which a measurement signal is generated by the digital converter of camera 36. An end-of-image-recording signal (P.I.=0) is then transmitted by system CTI 42 to pilot station 34 which can position the camera relative to the new zone scanned on the board (POS=1), by actual translation of the board. Meanwhile, system CTI 42 proceeds to reconstruct the image at its true location by the comparison test (T.I.=1). The results of this comparison test are stored in a buffer memory to be displayed later. On the other hand, as soon as the analysis of the image proper is over, an end-of-treatment signal (T.I.=0) is sent to pilot station 34 via system CTI 42. In the case illustrated here, this signal is sent after generation of the end-of-transport signal (POS=0) for the simple reason of length of analysis time.

As soon as pilot station 34 has picked up the end-of-image-analysis signal (T.I.=0) and the end-of-transport signal (POS=0), pilot station 34 transmits a new image-recording signal (P.I.=1) with indication of the serial number of the new zone ZE1 to be scanned. This is repeated until there are no more zones ZEi to be scanned unless the time elapsed since generation of the end-of-heating signal (CHAUF=0) has exceeded the validation time Vmax (e.g. 100 seconds). If it has, pilot station 34 orders a new board heating operation to allow its thermographic scanning to continue.

Of course the apparatus according to the invention is not confined to the equipment described here, be it the heating equipment or the infrared camera. Without departing from the framework of the invention, other variants use either a charge transfer camera (CCD type) or a linear scanning camera. In the latter case, the board moves in front of the camera synchronously with scanning by the camera. However, it is necessary for the camera to have a sufficiently large field to cover completely both the height and length of the board.

I claim:

1. A method for inspecting areas of a populated printed circuit board, comprising the following steps:
    continuously heating the board until a set temperature is measured at a target point on the board;
    defining a measurement validity time range that begins at a time after heating has stopped, and includes all subsequent times wherein a measured heat difference can be used to detect insufficient or irregular soldering material;
    recording a thermographic image of the board, the thermographic image consisting of instantaneous temperature measurements as a function of position on the board, at an instant in time within the measurement validity time range; and
    analyzing the thermographic image by detecting temperature differences between a predefined standard thermographic image and the thermographic image of the board.

2. The method according to claim 1, the step of analyzing being characterized by a predetermined maximum acceptable temperature difference for solder joint inspection being a function of an average temperature at the surface of board at the moment the step of heating stops.

3. The method according to claim 2 characterized by the maximum acceptable temperature difference being 3° C. for an average temperature at the surface of the board of about 70° C.

4. The method according to claim 1 characterized by the step of heating being stopped when the set temperature is measured at the surface of a target point on the board, and the surface temperature is on the order of 70° C.

5. The method according to claim 4 characterized by the step of heating of the board being regulated in accordance with a predefined temperature rise curve that provides gradual reduction of heating power in the vicinity of the set temperature.

6. The method according to claim 1 characterized by the board being heated in laminar fashion.

7. The method according to claim 1 characterized by the images being recorded in real time, by an infrared camera (36) operating in a spectral range between 8 and 12 microns.

8. The method according to claim 2 characterized by the image recording step being allowed only during a validity period starting at the moment the heating step stops, the duration of which validity period depends on said predetermined maximum acceptable temperature difference, the validity period lasting 100 seconds for an average temperature of 70° C. and a maximum acceptable temperature difference of 3° C.

9. The method according to claim 1 wherein the step of analyzing the image is characterized by a standard image being defined for each board type with two-dimensional geographic pinpointing of the locations of selected points on the printed circuit and the components of said circuit with which the board is populated.

10. The method according to claim 9, characterized by the geographic pinpointing being associated with a virtual division of the board into individual scanned zones (ZEi) corresponding to the spatial field of infrared camera (36), said geographic pinpointing identifying the actual locations inside each scanned zone (ZEi) of the various regions of the board to be inspected, for example the soldered areas to be inspected.

11. The method according to claim 10 characterized by the actual location of the region recognized to be defective, for example the area in which soldering has been found defective, being displayed.

12. The method according to claim 1 characterized by the temperature difference detection operation of the step of analyzing the image being carried out only on the portions of images corresponding to a predefined geographic grid of the regions of the board to be inspected, for example the soldered areas to be inspected.

13. The method according to claim 1 characterized by board (26) being completely imaged in the step of recording a thermographic image by lateral relative displacement of the camera field relative to the board, each camera/board position corresponding to coverage by the camera field of an individual scanned zone.

14. The method according to claim 1 characterized by the predefined standard in the step of analyzing the image being created by mixing a plurality of images obtained from reference boards of the same type deemed to be acceptable, said standard optionally being parametrizable.

15. The method according to claim 1 characterized by being used to inspect solder joints on printed circuit boards (26) populated with surface-mount (SM) components (12).

* * * * *

UNITED STATES PATENT AND TRADEMARK OFFICE
CERTIFICATE OF CORRECTION

PATENT NO. : 5,208,528
DATED : May 4, 1993
INVENTOR(S) : Alain Quintard

It is certified that error appears in the above-indentified patent and that said Letters Patent is hereby corrected as shown below:

TITLE PAGE, LINE 13:

In the Abstract, "heat between a predefined standard and the areas" should read --heat relative to a standard predefined for the areas--.

Column 7, line 15, "area" should read --are--.

Column 8, line 58, "pryrometer" should read --pyrometer--.

Column 10, line 60, "typed" should read --type--.

Signed and Sealed this

Twenty-seventh Day of December, 1994

Attest:

BRUCE LEHMAN

Attesting Officer       Commissioner of Patents and Trademarks